United States Patent [19]

Stribling et al.

[11] Patent Number: 5,142,554
[45] Date of Patent: Aug. 25, 1992

[54] DATA SEPARATOR WITH NOISE-TOLERANT ADAPTIVE THRESHOLD

[75] Inventors: Bradley C. Stribling, Danville; Roger J. O. Eline, Los Gatos, both of Calif.

[73] Assignee: Rose Communications, Inc., Santa Clara, Calif.

[21] Appl. No.: 607,989

[22] Filed: Oct. 31, 1990

[51] Int. Cl.⁵ .............................................. H04L 25/06
[52] U.S. Cl. ..................................... 375/76; 307/358; 307/362
[58] Field of Search .................. 375/76; 307/356, 358, 307/362, 363

[56] References Cited

U.S. PATENT DOCUMENTS

| | | | |
|---|---|---|---|
| 3,679,989 | 7/1972 | Thibodeau | 330/75 |
| 4,029,904 | 6/1977 | Papeschi | 375/76 |
| 4,175,256 | 11/1979 | Dolikian | 307/358 |
| 4,339,727 | 7/1982 | Kage et al. | 375/76 |

*Primary Examiner*—Benedict V. Safourek
*Assistant Examiner*—Young Tse
*Attorney, Agent, or Firm*—Blakely Sokoloff Taylor & Zafman

[57] ABSTRACT

A comparator-based digital data separator is modified to operate in noisy signal environments, with signals characterized by extreme duty cycle. A demodulated binary signal is passed through a pair of diodes which produce a slack voltage. The signal is then passed through an RC low-pass filter, and is finally connected to an input of the comparator as the reference voltage. The low-pass filter, which provides the D.C. averaged voltage to the threshold comparator, receives current into its own input only when the demodulated signal excursions exceed the existing threshold voltage by more than the slack voltage. Consequently, assuming there exists a sufficiently large recovered signal, the voltage being used as the decision threshold will remain separated from the recovered signal excursion peaks by at least the amount of slack voltage. In so doing, the binary data separation is given improved noise immunity and reduced sensitivity to duty cycle variations.

2 Claims, 6 Drawing Sheets

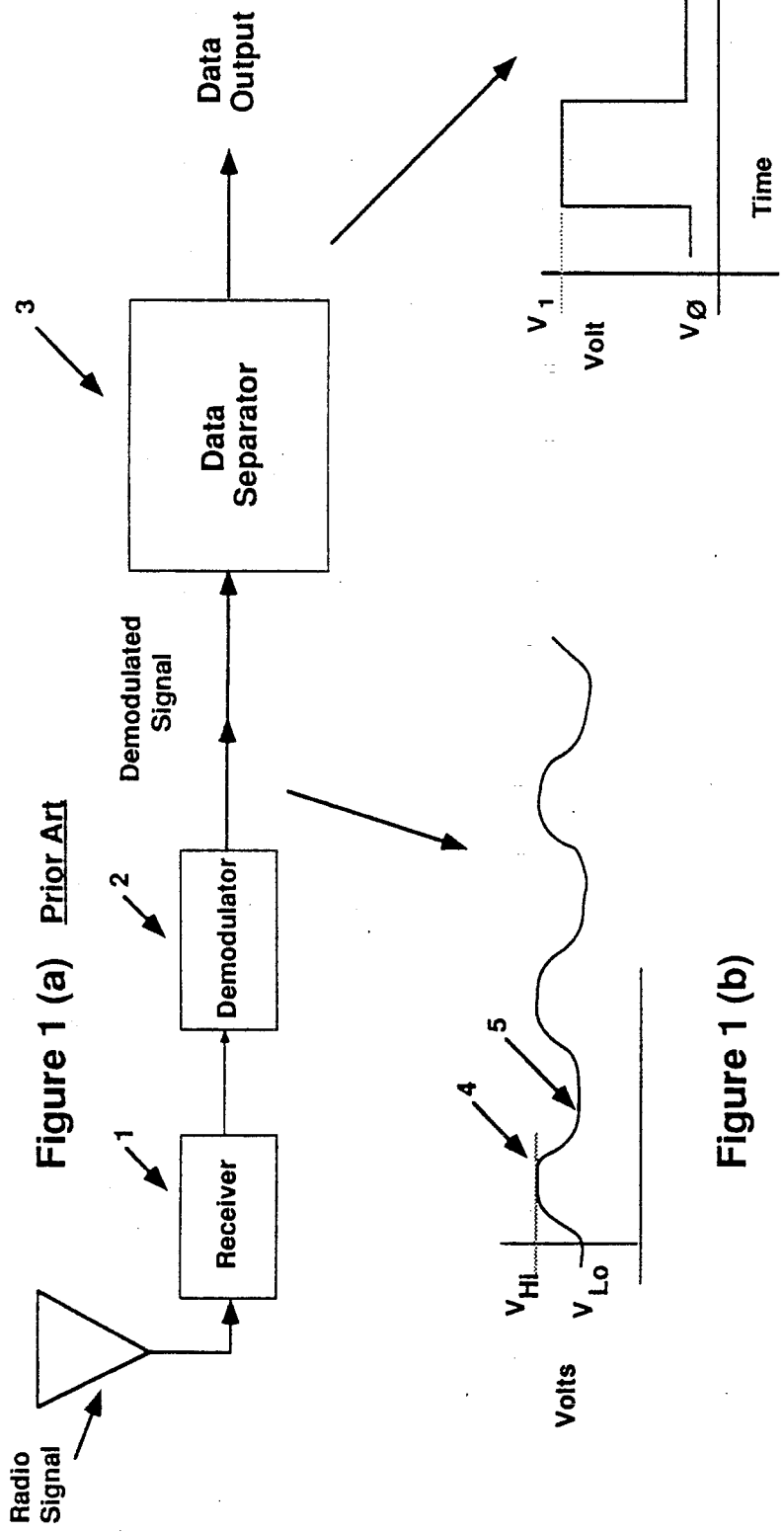

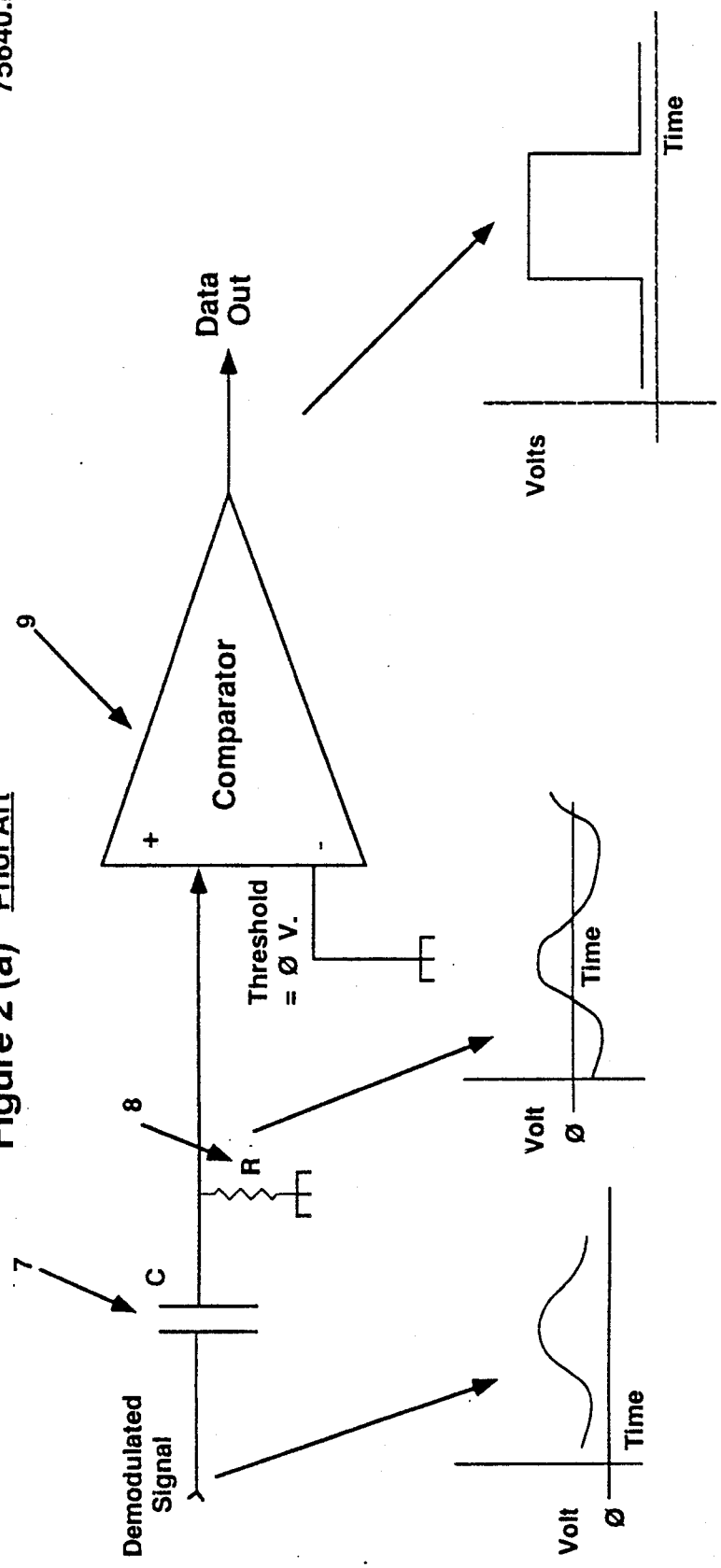

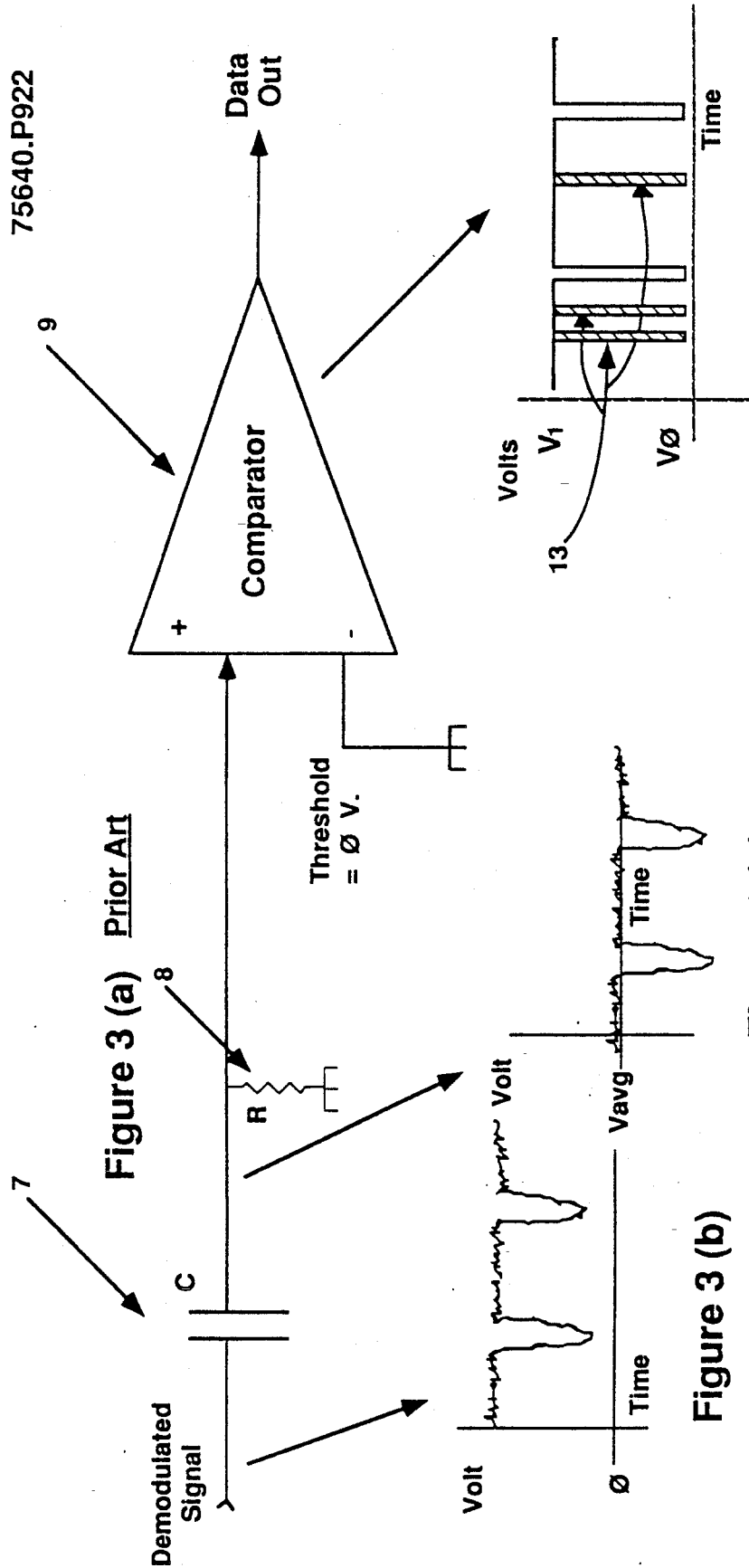

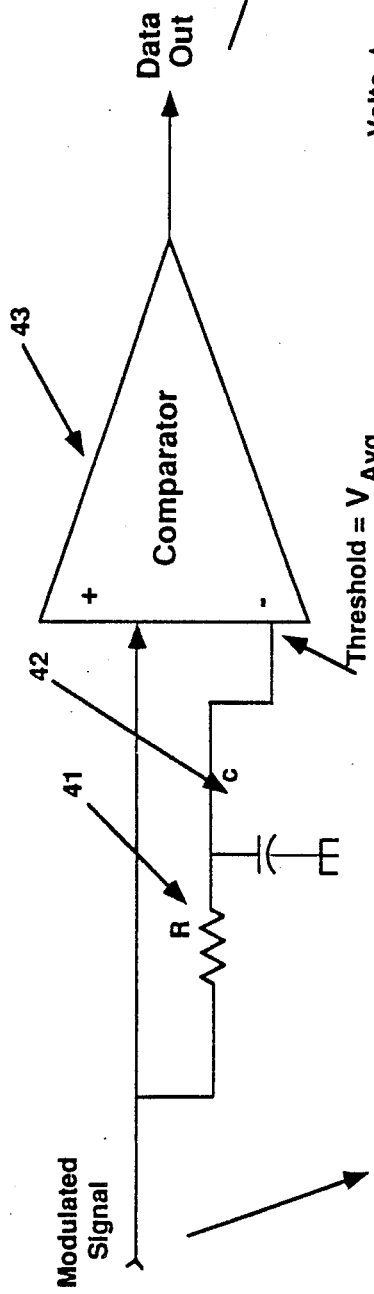
Figure 4 (a) <u>Prior Art</u>
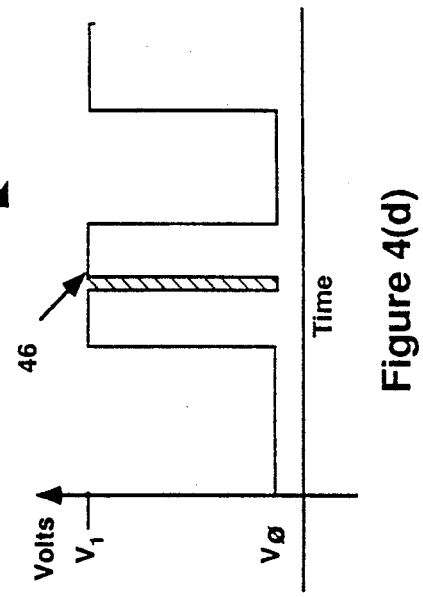
Figure 4(d)
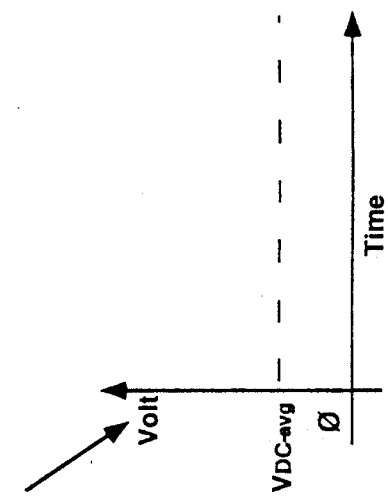
Figure 4(c)
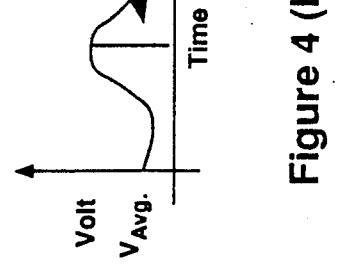
Figure 4 (b)

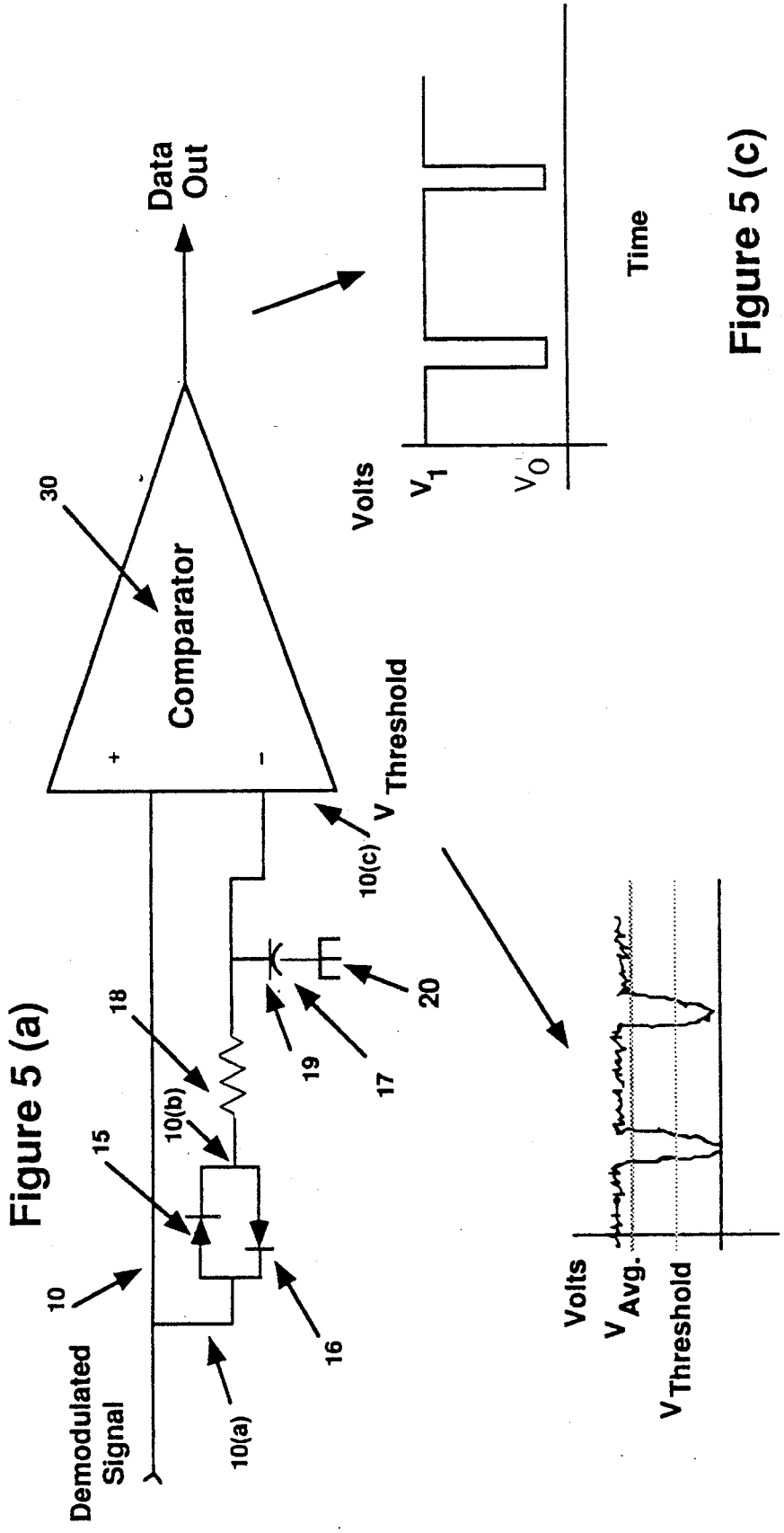

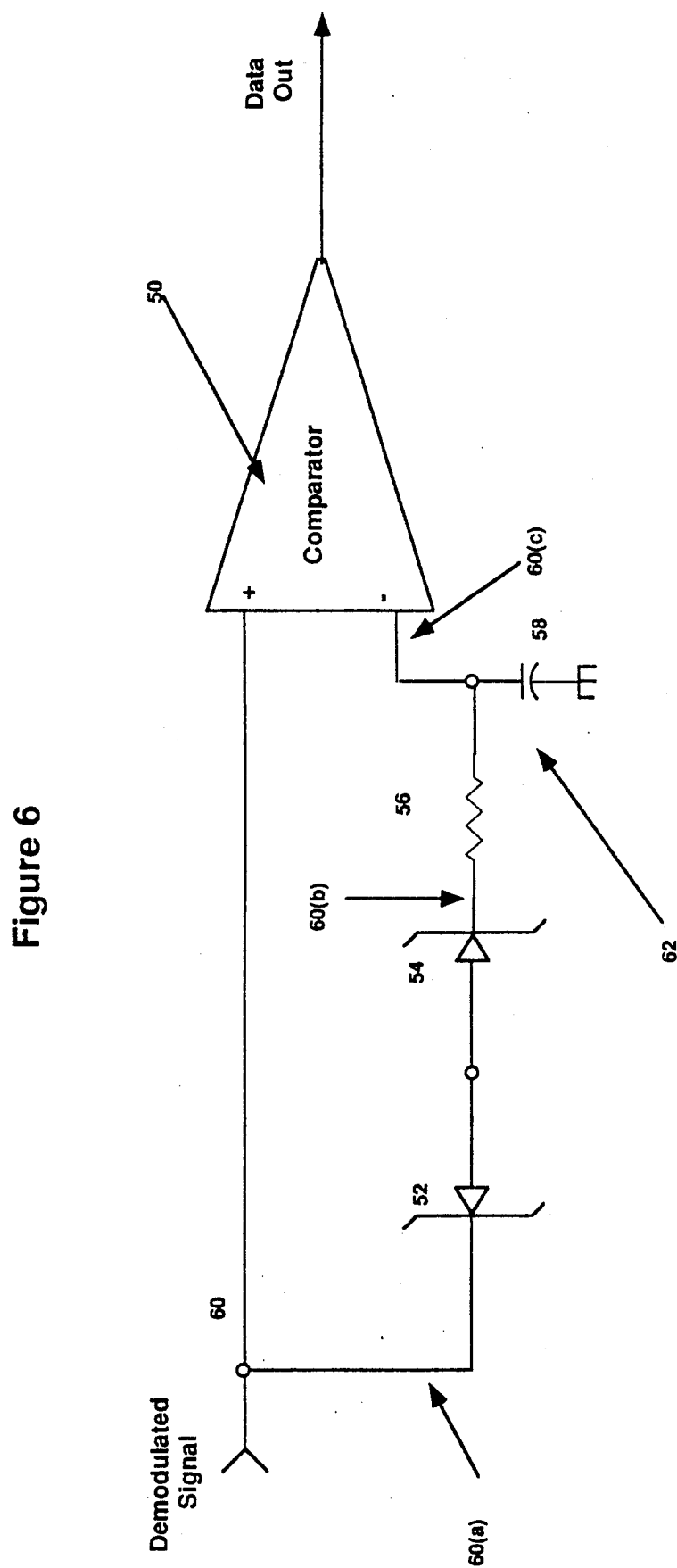

DATA SEPARATOR WITH NOISE-TOLERANT ADAPTIVE THRESHOLD

BACKGROUND OF THE INVENTION

1. Field of the Invention

The present invention relates to the separation of binary data from a demodulated data signal. More particularly, the present invention relates to the use of a comparator to separate binary data from a demodulated data signal in the presence of noise and arbitrary duty-cycle.

2. Art Background

This invention relates to the problem of binary data recovery in uncertain and noisy environments, as illustrated in FIGS. 1(a), 1(b), and 1(c). Typically, a data signal is derived from an original binary datastream recovered from a transmission medium (e.g., a radio channel), or a storage medium (e.g., a magnetic disk drive). FIG. 1(a) is a block diagram representation illustrating the separation of binary data from a radio signal received through a receiver 1, and demodulated by a demodulator 2. The demodulated signal is then fed to a data separator 3 which separates the binary data into digitally recognizable ones and zeros. FIG. 1(b) illustrates an exemplary input signal, and FIG. 1(c) illustrates the corresponding output signal. As is commonly the case, the demodulated data signal is corrupted by noise, or voltage excursions not part of the datastream as originally transmitted. Moreover, the demodulated signal may have imposed a D.C. bias, which is an offset from the ground voltage reference, originating from the circuitry used to receive and demodulate said binary signal. When the noise is not insignificant in relation to the signal amplitude, and when the D.C. offset is relatively large and of unknown or variable value, the task of deriving an accurate representation of the demodulated digital datastream from the signal in order to preserve the original sequence of logical ones and zeros becomes difficult. A comparator is generally chosen as data separator 3, determining whether a particular data value consists of a logical one or a logical zero, with the comparator's decision determined by a threshold reference voltage applied to the device. This threshold voltage should be approximately midway between the signal peaks 4, 5 (FIG. 1(b)), in order to provide the greatest immunity to errors from noise.

However, the D.C. offset of the demodulated signal is frequently unknown, or is of variable magnitude. Attention now is directed to FIGS. 2(a), 2(b), 2(c), and 2(d). A common approach to the D.C. offset problem, shown in FIG. 2(a), is to A.C. couple the signal by inserting a capacitor 7 between the demodulated signal and a comparator 9, with a resistor 8 shunt to ground. For an arbitrary demodulated binary signal, FIG. 2(b), the A.C. coupling shown in FIG. 2(a), will remove the D.C. average value of the demodulated signal. The demodulated signal, (FIG. 2(b)), then becomes centered such that the arithmetric average is zero volts (FIG. 2(c)). A reference threshold voltage value of zero volts is then applied to comparator 9. The output of comparator 9 is a digital waveform as shown in FIG. 2(d). The foregoing A.C. coupling method works reasonably well if the noise contained in the demodulated signal is not large and if the duty cycle of the datastream is not at an extreme, where the duty cycle is the percentage of time the demodulated signal occupies the logical one state per unit time.

Attention now is directed to FIGS. 3(a), 3(b), 3(c), and 3(d). Even with A.C. coupling, a data separation problem still may arise when noise is present and the demodulated data signal duty cycle is either very high or very low, i.e., lengthy periods of nearly all logical zeros or all logical ones (FIG. 3(b)). Because the A.C. coupling removes any D.C. average component from the demodulated signal before the demodulated signal reaches the comparator, the decision threshold voltage is no longer near the midpoint of the peaks. Rather, the decision threshold can be very near the value of either peak (FIG. 3(c)), any noise contained in the demodulated datastream can render the determination of digital ones and zeros by the comparator very susceptible to error. For example, when the duty-cycle of the demodulated datastream is at an extreme low condition, i.e., the datastream is almost all logical zeros, the average voltage of the demodulated datastream will be very close to logical zero. In such a case, a positive voltage spike due to noise could cause the comparator to "read" an unintended logical one, thereby inducing an error 13 in the derived output data signal (FIG. (3(d)).

FIGS. 4(a) and 4(b) illustrate a solution known in the art to the variable D.C. offset present on the demodulated signal. In FIG. 4(a), a resistor 41 and a capacitor 42 shunt to ground form a low-pass filter, wherein a low-pass filtered version of the demodulated signal is delivered to the threshold input of a comparator 43. In FIG. 4(a), a demodulated signal (FIG. 4(b)) is compared against its own D.C. average as a decision threshold voltage (FIG. 4(c)), producing an output signal (FIG. 4(d)). The configuration shown in FIG. 4(a) is virtually analogous to the A.C. coupling approach discussed above in relation to FIG. 2(a)-(d), except that the D.C. average of demodulated signal floats, and is not centered about zero volts. However, the configuration as shown in FIG. 4(a) is equally susceptible to noise-induced data errors when duty cycle nears an extreme. If a voltage spike due to noise is contained in the demodulated signal (FIG. 4(b), 45), comparator 43 will "see" the demodulated signal crossing the threshold reference of $V_{DCavg}$, and will output an opposite logical state. As a result, the output data signal will contain a data error 46.

As will be described below in more detail, a novel and simple solution to the above problems is provided by a key alteration to the above described standard circuitry.

SUMMARY OF THE INVENTION

A comparator-based digital data separator is modified to operate in noisy signal environments, with signals characterized by extreme duty cycle, by the inclusion of slack in the voltage averaging process. The demodulated signal is connected to one input of a comparator. The same demodulated signal is passed through a pair of silicon diodes, which produce a voltage difference between the demodulated signal and the diode pair output. The signal is then passed through an RC low-pass filter, and is finally connected to the other input of the comparator as the reference voltage. The low-pass filter, which provides the D.C. averaged voltage to the threshold comparator, receives current into its own input only when the demodulated signal excursions exceed the existing threshold voltage by more than the slack voltage. Consequently, assuming there exists a sufficiently large demodulated signal, the voltage being used as the decision threshold will remain separated from the demodulated signal excursion peaks by at least the amount of slack voltage. In so doing, the binary data separation is given improved noise immunity and reduced sensitivity to duty cycle variations.

BRIEF DESCRIPTION OF THE DRAWINGS

The objects, features and advantages of the present invention will be apparent from the following detailed description in which:

FIGS. 1(a), 1(b), and 1(c) illustrate the concept of data recovery from a demodulated signal.

FIG. 2(a) illustrates a prior art circuit using a comparator as a data separator with comparator input A.C. coupled and reference set to ground. FIGS. 2(b) and 2(c) represent input and filtered input waveforms respectively. FIG. 2(d) represents the digital output waveform.

FIGS. 3(a), 3(b), and 3(c) illustrate the prior art comparator-based data separator as in FIG. 2, wherein the demodulated signal duty cycle is at an extreme, i.e., the demodulated signal comprises of voltage states nearly all corresponding to either a logical one or a logical zero.

FIGS. 4(a), 4(b), 4(c), and 4(d) illustrate an alternative prior art embodiment of a comparator-based data separator to separate data without D.C. offset, and representative input and output waveforms thereof.

FIGS. 5(a), 5(b), and 5(c) illustrate a preferred embodiment and representative input and output waveforms of the present invention.

FIG. 6 illustrates an alternative embodiment of the present invention suitable for high voltage applications.

DETAILED DESCRIPTION OF THE INVENTION

A digital data separator with improved noise immunity is disclosed. In the following description, for purposes of explanation, specific numbers, times, signals, signal timing, architectures, etc. are set forth in order to provide a thorough understanding of the present invention. However, it will be apparent to one skilled in the art that the present invention may be practiced without these specific details. In other instances, well known circuits and devices are shown in block diagram form in order not to obscure the present invention unnecessarily.

In the binary data separator of the present invention, the comparator performing the zero-or-one determination in noisy or uncertain environments is supplied with a threshold reference voltage which affords improved immunity to noise in presence of D.C. offset voltages. For example, in cases of digital data signals being demodulated after radio transmission (as would be used, for example, in a radio telephone system such as the one described in copending U.S. patent application Ser. No. 07/609,000, titled "Digital Radio Telephone System," filed concurrently herewith) or retrieval from mass storage, the demodulated data signal is commonly corrupted by noise, or voltage offsets which were not part of the original datastream. In addition, the demodulated signal may have imposed upon it a voltage offset induced by the receiver and demodulator circuitry. When the noise and voltage offsets are large in relation to the data signal amplitude, deriving an accurate representation of the demodulated digital datastream in order to preserve the original sequence of digital voltage states becomes difficult. The improved noise immunity, especially evident in cases of extreme high or low duty cycle, is derived from the addition of a slack voltage to the reference voltage supplied to the comparator.

Referring now to FIG. 5(a), a demodulated digital signal 10 is routed to the non-inverting input of a comparator 30. A typical waveform of demodulated signal 10 is graphically shown in FIG. 5(b). A second branch 10a of the same demodulated digital signal 10 is connected to a first silicon diode 15, and a second silicon diode 16. Diodes 15 and 16 are connected in parallel, with the anode of diode 15 connected to the cathode of diode 16, and the cathode of diode 15 connected to the anode of diode 16. In the preferred embodiment, diodes 15 and 16 can be ordinary signal diodes, Schottky-type diodes, or Zener-type diodes. Passing through diodes 15 and 16, demodulated signal 10(a) is modified by the magnitude of the breakdown voltage characteristics of diodes 15 and 16. The breakdown-modified signal 10(b) is then passed through a low-pass filter 17. Low-pass filter 17 is comprised of a load resistor 18 and a capacitor 19 shunt to ground 20. The operative effect of low-pass filter 17 is to D.C. average modified signal 10(b), thereby forming threshold reference voltage 10(c). Both breakdown-modified signal 10(b) and threshold reference voltage 10(c) are diagrammatically shown in FIG. 5(b). Finally, the separated data appearing at the output of comparator 30 are shown in FIG. 5(c).

Still referring to FIG. 5, the slack voltage 10(b) is generated in any desired magnitude by the pair of diodes 15 and 16, slack voltage 10(b) being essentially the breakdown voltage of either diode 15 or 16. The back-to-back connection of diodes 15 and 16 give slack voltage separation for positive and negative values of demodulated signal 10(a). The magnitude of the slack voltage is the breakdown voltage of diodes 15 and 16. Referring to FIG. 5(b), a demodulated signal containing voltage excursion peaks is shown. Preferably, the value of the slack voltage is about one-half the peak-to-peak excursions of the demodulated data signal 10, but the slack value can vary slightly in the actual implementation and not affect the output. Choice of diode type for diodes 15 and 16 will depend on the amplitude of demodulated signal 10. For signals between 0.5 V peak-to-peak and 1.5 V peak-to-peak, a pair of diodes in parallel chosen from silicon signal diodes or lower voltage Schottky diodes will provide good values of the slack voltage 10(b). For larger signal amplitudes, combinations of diodes in parallel and series may be used. Alternatively, a pair of Zener diodes in series may be used with appropriately selected breakdown voltages. Referring now to FIG. 6, an embodiment suitable for larger input voltage applications is shown. In FIG. 6, the data separation of the present invention is configured with Zener diodes. A larger voltage input signal 60(a) is applied to Zener diodes 52 and 54, which are connected in opposite directions to provide symmetry for both positive and negative polarity of input voltage 60(a). The reverse breakdown characteristics of Zener diodes 52 and 54 give rise to a slack voltage 60(b). Following Zener diodes 52 and 54, slack voltage 60(b) is filtered by a low pass filter 62, formed by resistor 56 and capacitor 58. The output of low pass filter 62 provides a modified average threshold voltage 60(c) as an input for comparator 50.

The equations which describe the advantageous effects of slack are as follows:

Without slack voltage:

$$V_{threshold} = V_{hi} \times D + V_{lo} \times (1 - D)$$
$$= V_{lo} + D \times (V_{hi} - V_{lo})$$

where, $V_{hi}$ = voltage for a logical one
$V_{lo}$ = voltage for a logical zero
D = duty cycle, or percentage of logical one voltage states per unit time
$V_{threshold}$ = voltage delivered to comparator for decision basis.

Note that when D is near 0 (i.e., the demodulated datastream consists of almost all logical zeros), $V_{threshold}$ is near $V_{lo}$, and when D is near 1 (i.e., the demodulated datastream consists of almost all logical ones), $V_{threshold}$ is near $V_{hi}$. In either case, noise on top of the demodulated signal results in one-or-zero data decisions which are unreliable.

Alternatively, with slack voltage:

$$V_{threshold} = (V_{hi} - V_{slack}) \times d + (V_{lo} + V_{slack}) \times (1 - D)$$
$$= V_{lo} + V_{slack} + D \times (V_{hi} - V_{lo} - 2V_{slack})$$

where, $V_{slack}$ = slack voltage

Note that when D is near 0, $V_{threshold}$ is near $V_{lo}+V_{slack}$, and when D is near 1, $V_{threshold}$ is near $V_{hi}-V_{slack}$, thereby providing a noise immunity of an amount equal to $V_{slack}$.

Although the invention has been described in conjunction with the preferred embodiment, numerous alternatives, variations, modifications and uses will be apparent to those skilled in the art in light of the foregoing description.

The foregoing has described a binary data separator with improved noise immunity and reduced sensitivity to duty cycle. It is contemplated that changes and modifications may be made by one of ordinary skill in the art, to the materials and arrangements of elements of the present invention without departing from the spirit and scope of the invention.

I claim:

1. A data separation circuit with improved noise immunity for providing a separation means for binary voltage states within a demodulated digital signal of arbitrary duty cycle and non-uniform excursion peak voltage, said circuit comprising:

a comparator having a first input and a second input, the first input receiving said demodulated digital signal; and a threshold means for adaptively generating a noise-tolerant decision threshold voltage, said threshold means having an input to receive said demodulated digital signal and an output coupled to the second input of said comparator, said threshold means comprising;

a slack means connected to receive the demodulated digital signal for generating a slack voltage, said slack means comprising, a first and second Schottky diodes, each of said Schottky diodes having an anode and a cathode, said anode of said first Schottky diode is connected to receive said demodulated digital signal and said cathode of said first Schottky diode is connected to said low-pass filter, said anode of said second Schottky diode is connected to said low-pass filter and said cathode of said second Schottky diode is connected to receive said demodulated digital signal, said slack voltage constituting a difference in voltage between said demodulated digital signal and a predetermined minimum voltage to be generated by said threshold means, said slack means producing an output slack voltage only when said demodulated digital signal exceeds the predetermined minimum voltage of said slack means, and a low-pass filter having an input to receive the output of the slack means and an output coupled to the second input of said comparator for generating the average voltage of said demodulated digital signal, said low pass filter receiving said slack voltage from said slack means and therefrom producing a modified average voltage of said demodulated digital signal, said modified average voltage being the output of said threshold means, whereby the modified average voltage used as threshold the decision voltage by said comparator will remain separated from the demodulated digital signal's excursion peaks by at least the slack voltage, said data separation circuit resulting in an improved noise immunity and reduced sensitivity to duty cycle variation.

2. A data separation circuit with improved noise immunity for separating binary voltage states within a demodulated digital signal of arbitrary duty cycle and non-uniform excursion peak voltage, said circuit comprising:

a comparator having a first input and a second input, the first input receiving said demodulated digital signal;

first and second Schottky diodes having a characteristic breakdown voltage, said first and second Schottky diodes further having p and n terminals in parallel connection for generating a slack voltage, said slack voltage constituting a characteristic difference in voltage between said demodulated digital signal and a predetermined desired voltage value to be generated; and a low-pass filter having an input connected to receive said slack voltage from said first and second Schottky diodes and an output coupled to the second input of said comparator for generating the average voltage of said digital signal, wherein the p terminal of said first Schottky diode is connected to receive said demodulated digital signal and the n terminal connected to said low-pass filter, the p terminal of said second Schottky diode connected to said low-pass filter and the n terminal connected to receive said demodulated digital signal, said first and second Schottky diodes producing a voltage only when said demodulated digital signal exceeds said first and second Schottky diodes' characteristics breakdown voltage; and said low pass filter receiving said slack voltage from said first and second Schottky diodes and producing therefrom a modified average of the demodulated digital signal voltage, said modified average being connected to the second input of said comparator, whereby the modified average voltage used as the decision threshold by said comparator will remain separated from the demodulated digital signal's excursion peaks by at least the slack voltage, said data separation circuit resulting in an improved noise immunity and reduced sensitivity to duty cycle variation.

* * * * *